US006677769B2

(12) United States Patent
Whitaker et al.

(10) Patent No.: US 6,677,769 B2
(45) Date of Patent: Jan. 13, 2004

(54) SCANNING ELECTROMAGNETIC-FIELD IMAGER WITH OPTICAL-FIBER-BASED ELECTRO-OPTIC FIELD-MAPPING SYSTEM

(75) Inventors: John Firman Whitaker, Dexter, MI (US); Kyoung Yang, Ann Arbor, MI (US); Linda P. B. Katehi, Northville, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 214 days.

(21) Appl. No.: 09/877,936

(22) Filed: Jun. 8, 2001

(65) Prior Publication Data

US 2002/0036491 A1 Mar. 28, 2002

Related U.S. Application Data

(60) Provisional application No. 60/210,880, filed on Jun. 9, 2000.

(51) Int. Cl.[7] .............................................. G01R 31/308
(52) U.S. Cl. ........................................ 324/753; 324/96
(58) Field of Search .................... 324/96, 753; 359/237, 359/245, 246, 247, 256, 257, 258

(56) References Cited

U.S. PATENT DOCUMENTS

| 4,737,775 | A |   | 4/1988  | Tokuda et al. ............... 340/647 |
| 4,928,058 | A |   | 5/1990  | Williamson ................... 324/96 |
| 5,111,135 | A |   | 5/1992  | Kozuka et al. ............... 324/96 |
| 5,278,499 | A |   | 1/1994  | Ito et al. .................... 324/244.1 |
| 5,412,330 | A |   | 5/1995  | Ravel et al. ................. 324/753 |
| 5,459,394 | A |   | 10/1995 | De Kort et al. ............... 324/96 |
| 5,583,445 | A | * | 12/1996 | Mullen ........................ 324/753 |
| 5,952,818 | A |   | 9/1999  | Zhang et al. .................. 324/96 |
| 6,075,603 | A | * | 6/2000  | O'Meara et al. ............. 356/496 |

FOREIGN PATENT DOCUMENTS

| GB | 2343964    | 5/2000  |
| JP | 63-151867  | 6/1988  |
| WO | WO 97/45747 | 12/1997 |
| WO | WO 99/41619 | 8/1999  |

OTHER PUBLICATIONS

Wakana, S. et al.; "Novel Electromagnetic Field Probe Using Electro/Magneto–Optical Crystals Mounted on Optical Fiber Facets For Microwave Circuit Diagnosis"; *IEEE MIT–S Digest* (2000) p. 1615–1618 (Month Unavailable).

Wakana, S. et al.; "Fiber–Edge Electrooptic/Magnetooptic Probe for Spectral–Domain Analysis of Electromagnetic Field"; *IEEE Transactions on Microwave Theory and Techniques*; Vol 48, No. 12 (Dec. 2000) p. 2611–2616.

(List continued on next page.)

*Primary Examiner*—Ernest Karlsen
*Assistant Examiner*—Russell M. Kobert
(74) *Attorney, Agent, or Firm*—Young & Basile, P.C.

(57) ABSTRACT

A microwave and millimeter-wave electric-field mapping system based on electro-optic sampling has been developed using micromachined Gallium Arsenide crystals mounted on gradient index lenses and single-mode optical fibers. The probes are able to detect three orthogonal polarizations of electric fields and, due to the flexibility and size of the optical fiber, can be positioned not only from the extreme near-field to the far-field regions of microwave and millimeter-wave structures, but also inside of enclosures such as waveguides and packages. A microwave electric-field-mapping system based on micromachined GaAs electro-optic sampling probes mounted on gradient index lenses and single-mode optical fibers can extract field images from the interior of an enclosed microwave cavity.

36 Claims, 10 Drawing Sheets

OTHER PUBLICATIONS

Yang, K. et al.; "Active–Amplifier–Array Diagnostics Using High–Resolution Electrooptic Field Mapping"; *IEEE Transactions on Microwave Theory and Techniques*; vol. 11 No. 4 (May 2001) p. 849–857.

Valdmanis, J. et al.; "Subpicosecond Electrooptic Sampling: Principles and Applications"; *IEEE Journal of Quantum Electronics*; Vol. QE–22, No. 1 (Jan. 1986) p. 69–78.

Heutmaker, M.S. et al.; "Electrooptic Sampling of a Packaged High–Speed GaAs Integrated Circuit"; *IEEE Journal of Quantum Electronics*; vol. 24, No. 2 (Feb. 1988) p. 226–233.

Nagatsuma, T. et al.; "Subpicosecond sampling using a noncontact electro–optic probe"; *J. Appl. Phys.*; vol. 66, No. 9 (Nov. 1989) p. 4001–4009.

Hjelme, D. et al.; "Voltage Calibration of the Direct Electrooptic Sampling Technique"; *IEEE Transactions on Microwave Theory and Techniques*; vol. 40, No.10 (Oct. 1992) p. 1941–1950.

Song, J. et al.; "An Equivalent Circuit Model of the Optical Probe in Electro–Optical Sampling Systems"; *Microwave and Optical Technology Letters*; vol. 6, No. 8 (Jun. 1993) p. 493–498.

Thomann, W. et al.; "Optimization of Electrooptic Sampling by Volume–Integral Method"; *IEEE Transactions on Microwave Theory and Techniques*; vol. 41, No. 12 (Dec. 1993) p. 2392–2399.

Pfeifer, T. et al.; "Optoelectronic On–Chip Characterization of Ultrafast Electric Devices: Measurement Techniques and Applications"; *IEEE Journal of Selected Topics in Quantum Electronics*; vol. 2, No. 3 (Sep. 1996) p. 586–604.

Pfeifer, T. et al.; "Three–dimensional experimental analysis of the near–field and far–field radiation of planer millimeter–wave transmitters"; *OSA Trends in Optics and Photonic Sensors (TOPS)*; Vol 13 (Date Unavailable).

Pfeifer, T. et al.; "Electro–Optic Near–Field Mapping of Planar Resonators"; *IEEE Transactions on Antennas and Propagation*; vol. 46, No. 2 (Feb. 1998) p. 284–291.

Mueller, P. et al.; "New Calibration Method in Electrooptic Probing Due to Wavelength Control and Fabry–Perot Resonance"; *IEEE Transactions on Microwave Theory and Techniques*; vol. 47, No. 3 (Mar. 1999) 308–314.

Cecelja, F. et al.; "Electrooptic Sensor for Near–Field Measurement"; *IEEE Transactions on Instrumentation and Measurement*; vol. 48, No. 2 (Apr. 1999) p. 650–653.

Yang, K. et al.; "High–Resolution Electro–Optic Mapping of Near–Field Distributions in Integrated Microwave Circuits"; *IEEE MTT–S Digest* (1988) p. 949–952. (Month Unavailable).

David, G. et al.; "Electro–Optic Mapping of Guided and Radiated Electric Fields from Microwave Integrated Circuits and Antennas"; CLEO '98, Post–Deadline Paper (May 1998) p. 1,2.

David, G. et al.; "3D Near–Field Analysis of a 4×4 Grid Oscillator Using an Electro–Optic Field Imaging System"; 28th European Microwave Conference (Oct. 5–9, 1998) p. 1–6.

David, G. et al.; "Electro–Optic Imaging of Millimeter–Wave Field Distributions"; Lasers and Electro–Optics Society Annual Meeting (LEOS '98) (Dec. 1998) p. 1,2.

Yang, K. et al.; "Electro–Optic Field Mapping of Quasi–Optic Power–Combining Arrays"; 1999 Ultrafast Electronics and Optoelectronics Conference (Apr. 1999) p. 1–4.

Yang, K. et al.; "Far–Field Analysis of a Ka–Band Patch Antenna Array Using High–Resolution Electro–Optic Near Field Mapping"; 2000 European Microwave Conference (2000) p. 1–3 (Month Unavailable).

Yang, K. et al.; "Microwave–Field Imaging with a Fiber–Based Electro–Optic Probe"; LEOS 2000 (Nov. 2000) p. 1–3.

Yang, K. et al.; "Fiber–Based Electro–Optic Field Imaging System"; 2001 Ultrafast Electronics and Optoelectronics Conference (2001) p. 1–3 (Month Unavailable).

Yang, K. et al.; "Electrooptic Mapping of Near–Field Distributions in Integrated Microwave Circuits"; *IEEE Transactions on Microwave Theory and Techniques*; vol. 46, No. 12 (Dec. 1998) p. 2338–2343.

Yang, K. et al.; "Electrooptic mapping and Finite–Element Modeling of the Near–Field Pattern of a Microstrip Patch Antenna"; *IEEE Transactions on Microwave Theory and Techniques*; vol. 48, No. 2 (Feb. 2000) p. 288–294.

Yang, K. et al.; "Electro–optic field mapping system utilizing external gallium arsenide probes"; *Applied Physics Letters*; vol. 77, No. 4 (Jul. 2000) p. 486–488.

Yang, K. et al.; "Electric Field Mapping System Using an Optical–Fiber–Based Electrooptic Probe"; *IEEE Microwave and Wireless Components Letters*; vol. 11, No. 4 (Apr. 2001) p. 164–166.

* cited by examiner

Fiber-Based Electro-Optic Sampling System
Probe Tip Fabrication - (100) GaAs etching depth ~ 160 μm (7.95 μm/min x 20 min)
(lateral : 130~150 μm, 6.5~7.5 μm/min)

**Fiber-Based Electro-Optic Sampling System
Probe Head Assembly**

SCANNING ELECTROMAGNETIC-FIELD IMAGER WITH OPTICAL-FIBER-BASED ELECTRO-OPTIC FIELD-MAPPING SYSTEM

This application claims the benefit of provisional application No. 60/210,880 filed Jun. 9, 2000.

STATEMENT REGARDING FEDERALLY SPONSORED RESEARCH OR DEVELOPMENT

The US Government has a paid-up license in this invention and the right in limited circumstances to require the patent owner to license others on reasonable terms as provided for by the terms of primary Grant No. DAAG-55-97-0132 awarded by the Army Research Office to Clemson University which subcontracts to the University of Michigan by the terms of Grant No. 321-2000222, and Grant No. PHY8920108 awarded by the National Science Foundation.

FIELD OF THE INVENTION

The present invention relates to a fiber-based electro-optic system with a probe tip, and polarization control of the beam of light, and in particular, a method and apparatus for scanning a workpiece to be tested using a fiber-based electro-optic system.

BACKGROUND OF THE INVENTION

Electro-optic (EO) field mapping is becoming recognized as a promising diagnostic measurement technique for the microwave and millimeter-wave regimes. Due to the single-micrometer spatial-resolution, broad bandwidth (>100-GHz bandwidth), and low invasiveness, EO field mapping has been used for fault isolation of microwave integrated circuits, extreme-near-field mapping and near-to-far-field-transition characterization of antenna elements, performance verification of various active quasi-optical power-combining arrays, and performance testing of active and passive antennas.

SUMMARY OF THE INVENTION

A new field-mapping system according to the present invention has been developed using fiber-mounted, micromachined GaAs crystals as the electric-field sensors, based on the initial embodiment of the EO field-mapping system, known as a "free-space measurement system" since both the detection and signal laser beams traveled in the open air and for which applications have been limited to exposed, planar structures. This system according to the present invention is much less prone to disturb the device under test (DUT), and provides enhanced flexibility to probe many different structures from a variety of perspectives. Due to the flexibility of the optical fiber and the small size of a micromachined GaAs tip, the fiber-based electro-optic probes may be inserted into enclosures such as waveguides and packages in order to measure electric fields. While a similar concept for a fiber-based field sensor has been recently demonstrated in measurements of 1 GHz microwave signals, the use of such a probe for phase measurements, measurement inside of packages, high-frequency (Ka-band) microwave signal measurements, and the characterization of three orthogonal field components has not been known until the present invention.

An electric-field-mapping technique according to the present invention serves as the foundation for an instrument that will benefit the design, development, production, and quality control of microwave and millimeter-wave antennas, devices, and integrated circuits. The technique senses the electric field from a device under test when the microwave signal modulates a laser beam in a micromachined-GaAs electro-optic crystal. This probe is mounted on an optical fiber in order to provide optimal positioning flexibility and a confined path for the optical beam that returns from the probe with the microwave-field information. Ultrabroadband-field-mapping has been demonstrated for signals of frequencies between 80 MHZ and W band to take advantage of the short-pulse nature of the laser source. The electro-optic sensor according to the present invention is purely a dielectric with no conductive components, as compared with other field probes that use metalized antennas and contain grounded electrodes. Therefore, the probe can be placed very close to the device under test, even into the near field of radiating elements, and extract field information with minimal invasiveness. This is an advantage over every other type of field probe, and it allows the electro-optic sensor to extract the complete electric field information from a device, including evanescent fields and surface modes. Another advantage of the electro-optic probe is the spatial resolution, which at ~5 micrometers leads to high-resolution capabilities that are important for high frequency antenna arrays and for integrated circuits. The electro-optic sensors also are used to isolate the vector electric-field polarizations from a device with a high degree of isolation between orthogonal field components.

The electro-optic probe produces two-dimensional maps of the amplitude and phase of the electric field in any plane above the device under test. It thus provides a capability unique compared to any other measurement instrument for viewing the signals in one part of a microwave circuit or array relative to any other part of the circuit. This capability has also been extended to the interior of enclosed microwave packages, where the probe will be able to diagnose crosstalk and interference between devices and interconnects. The electro-optic probe will be of use in the development or troubleshooting of any design that uses parallel paths where the phase of the electrical signal on one path has a specific relationship to the phase of another signal. The sensor can also be used for fault isolation or failure analysis, as well as validation of electromagnetic models. Since this non-contacting probe has a high impedance and yet is still a broadband sensor, it can also be used to make quantitative S-parameter measurements in certain instances, without the need to de-embed cables or transitions. The fiber-based electro-optic field-mapping technique has been implemented in a working, research-lab, bench-top prototype.

A fiber-based electro-optic field mapping system has been developed using micromachined GaAs probe tips. The fiber-based system has lower permittivity than other scanning field probes, provides excellent measurement flexibility so that the scanning can be performed at any arbitrary orientation, and allows insertion of the field sensor into microwave enclosures and packages. In particular, the fiber-based EO field mapping system makes it possible to extract electric field distributions of complicated micro- and millimeter wave circuits shielded by metal walls. The fiber-based EO system can be applied to the design, characterization, and failure analysis of quasi-optical power-combining arrays, power amplifiers, and other microwave and millimeter wave systems.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF THE PREFERRED AND ALTERNATIVE EMBODIMENTS

Figure 1:
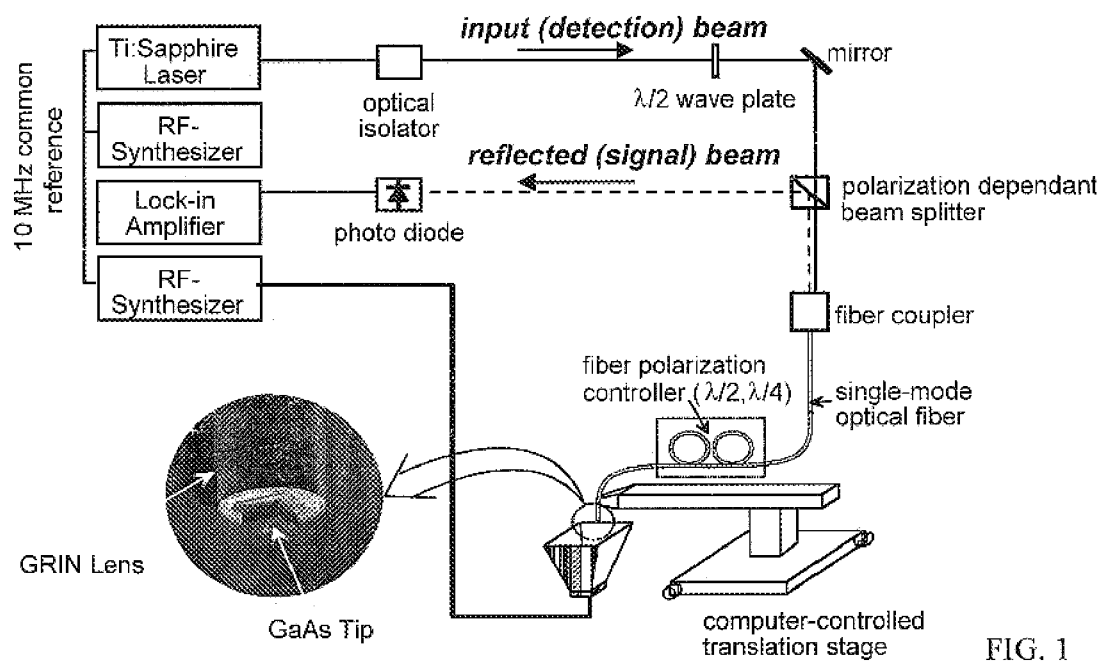
FIG. 1 illustrates an example of a fiber-based electro-optic sampling system shown in schematic view according to the present invention.

FIG. 1 illustrates an example of a fiber-based electro-optic sampling system shown in schematic view according to the present invention. A common reference is provided to a Ti:Sapphire laser, a lock-in amplifier, and two RF-synthesizers. As is conventional, the common reference includes a 40 megahertz (MHZ) reference signal generated by the laser control box, which is multiplied by 2 prior to being sent to the laser, and divided by 4 prior to being sent to two radio frequency (RF) synthesizers. One synthesizer generates another lower-frequency reference signal that is input to the lock-in amplifier. The Ti:Sapphire laser generates an input or detection beam through an optical isolator. The beam passes through a $\lambda/2$ wave plate, sometimes called a "half-wave" plate, and can be redirected by one or more mirrors as required. The initial half-wave plate sets the polarization going into a polarization-dependent beam splitter. The input or detection beam passes through the polarization dependent beam splitter prior to entering a fiber optic coupler. A single-mode optical fiber extends between the fiber optic coupler through a fiber optic polarization controller ($\lambda/2$ or half-wave, $\lambda/4$ or quarter-wave), and attaches to a computer-controlled translation stage, prior to arriving at a gradient index (GRIN) lens attached at the other end of the single-mode optical fiber to focus the beam into the attached GaAs crystal tip. One part of the polarization controller is used to rotate (i.e. acting as a half-wave plate) the linear polarization of the laser relative to the crystal axes of a GaAs probe tip to be described in greater detail below. The beam passes through the GRIN lens and into the GaAs probe tip. The light polarization is modulated by the microwave electric field in the GaAs (the electro-optic effect) as the beam passes through the crystal. The signal beam is reflected off from a high-reflecting (HR) dielectric coating on the open end of the GaAs crystal. The reflected or signal beam passes from the tip back through the GRIN lens, into the optical fiber. The polarization of the laser light is now elliptical, and another part of the polarization controller is used as a quarter-wave plate to convert this beam back into a linear polarization. The reflected beam after passing through the fiber polarization controller of the single-mode optical fiber, then passes through the fiber optic coupler to the polarization dependent beam splitter, where, depending on the angle of the linear polarization, part of the reflected beam is directed to a photo diode in communication with the lock-in amplifier.

Figure 2:
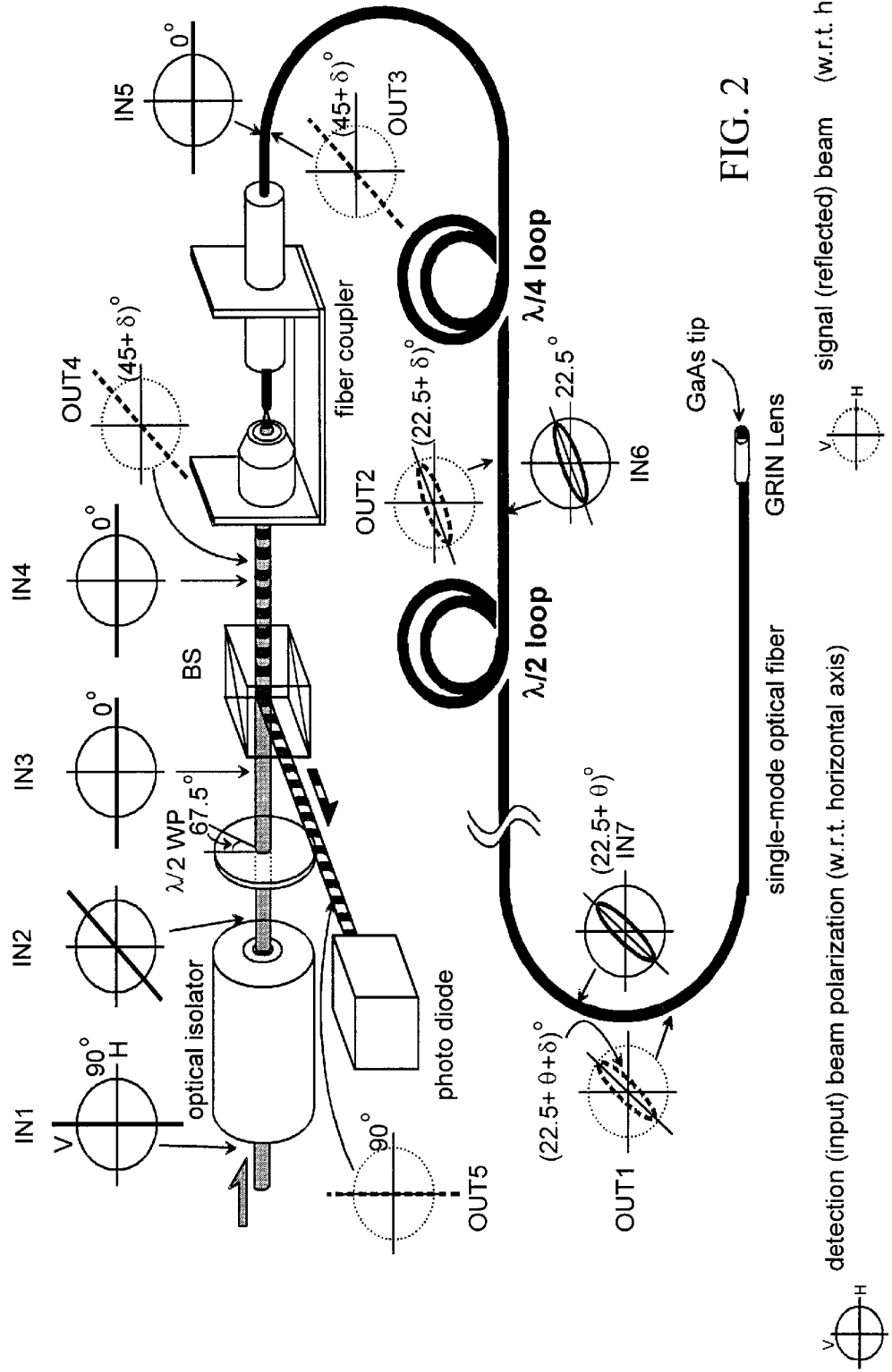
FIG. 2 illustrates the system in greater detail between the optical isolator, $\lambda/2$ wave plate, beam splitter, fiber coupler, fiber polarization controller, and termination of the single-mode optical fiber at the gradient index lens and GaAs tip.

FIG. 2 illustrates the system in greater detail between the optical isolator, $\lambda/2$ wave plate, beam splitter, fiber coupler, fiber polarization controller, and termination of the single-mode optical fiber at the gradient index lens and GaAs tip. FIG. 2 shows the beam polarization characteristics as the beam passes through the various components as an input or detection beam, and also as the signal or reflected beam is returned through the single-mode optical fiber, through the beam splitter, to the photo diode.

Figure 3:
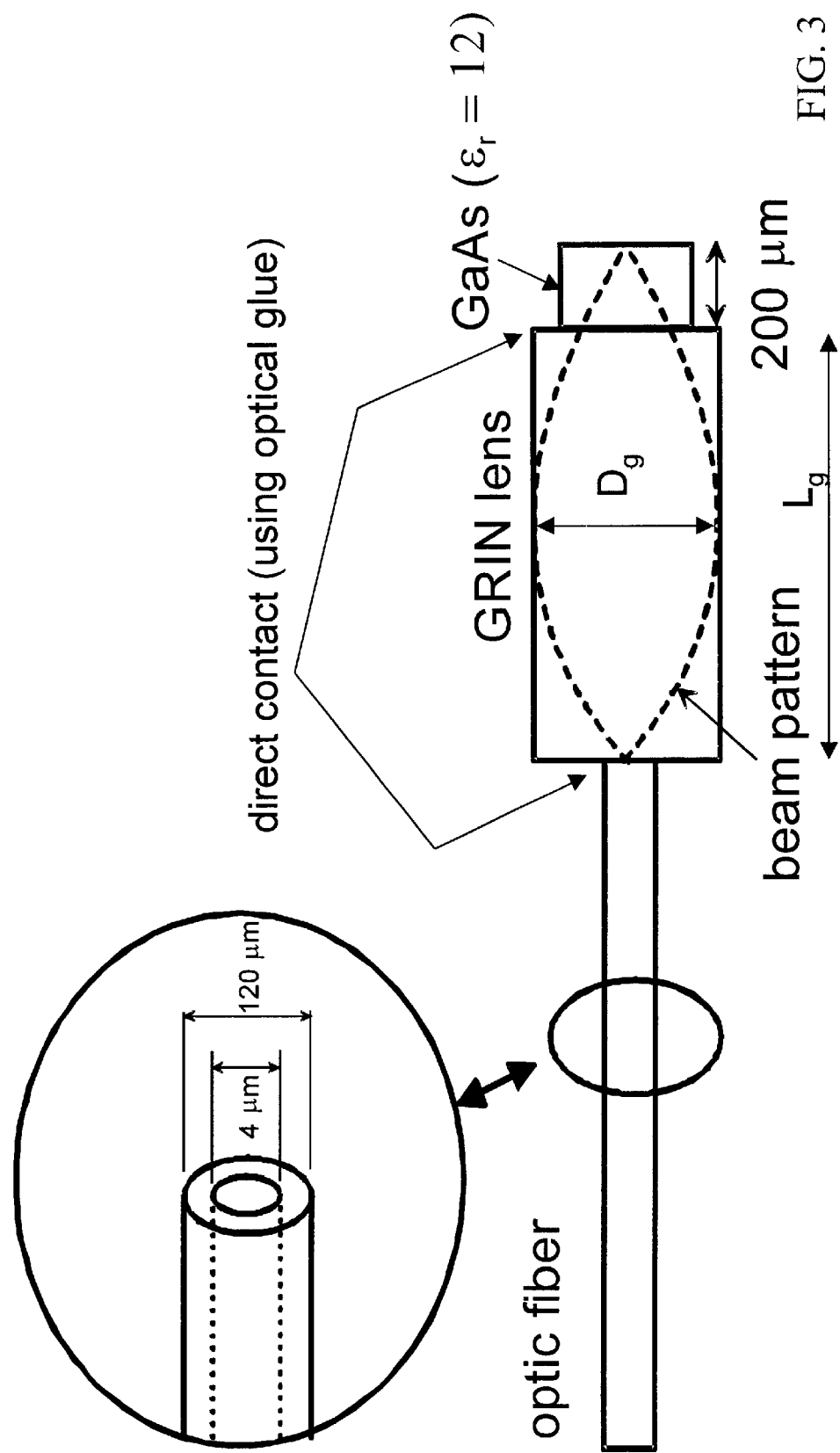
FIG. 3 illustrates the fiber-based electro optic sampling system gradient index lens according to the present invention.
Figure 4:
FIGS. 4 through 7 illustrate a probe tip fabrication procedure or method according to the present invention.
Figure 4:
Figure 4:
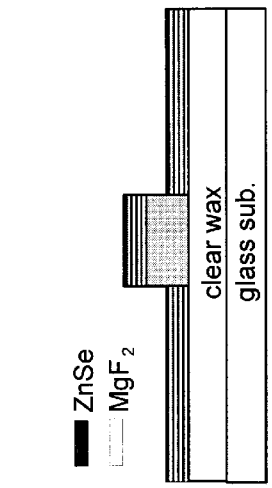
Figure 4:
Figure 4:

FIG. 3 illustrates the fiber-based electro optic sampling system gradient index lens according to the present invention. The optic fiber by way of example can be approximately 120 micrometers ($\mu$m) in diameter with an interior core dimension of 4 micrometers ($\mu$m). The optic fiber is in direct contact with the gradient index lens using an appropriate optical cement. The length and the diameter of the gradient lens is selected to focus the beam on the face of the probe tip. The probe tip in the illustration of FIG. 3 is shown to be a GaAs crystal ($\epsilon$=12) with a thickness approximately equal to 200 micrometers ($\mu$m) or 350 micrometers ($\mu$m). The laser wave length is greater than or approximately equal to 890 nanometers (nm) in order to avoid absorption of the light in the GaAs.

Referring again to FIG. 1, a schematic diagram of the fiber-based EO sampling system used in this work is illustrated. In general, the optical pulse-train from a phase-stabilized, mode-locked laser (100-fs-duration pulses; 80-MHZ pulse repetition rate) is modulated via the Pockels effect in the GaAs electro-optic crystal by the RF field to be imaged. The laser wavelength is tuned to $\geq$890 nm and the average input power to the fiber is attenuated to around 15 mW also to avoid absorption by the GaAs. The GaAs electro-optic field imaging according to the present invention provides the probe tip integrated with an optical fiber, vastly improving the positioning ability of the probe and the optical coupling. The polarization-dependent beam-splitter limits the optical transmission to one particular polarization, and this beam is focused into the single-mode optical fiber using a commercial fiber-coupler. A gradient-index (GRIN) lens with diameter of 1.0 mm and length of 5.0 mm is mounted at the opposite end of the fiber to focus the beam onto the surface of the GaAs crystal, which is attached to the GRIN lens using transparent cement. In order to align the linear polarization of the laser to the optic axis of the GaAs and to manipulate the elliptical polarization of the light returning from the probe, two polarization-controlling loops are introduced into the fiber to serve as half- and quarter-wave plates.

The beam reflected from the probe contains the electro-optic signal, modulated by the RF electric field so that it possesses an additional polarization angle, $\delta$. The signal beam is rerouted to the photodiode by the beam splitter, which also converts $\delta$ into an intensity change, and the optical signal is transformed into an electrical signal via the photodiode.

The GaAs tips, with 500×500-micrometer ($\mu$m) footprint area and 200-micrometer ($\mu$m) thickness, have a highreflection optical coating deposited on the exposed surface. A <100> orientated GaAs tip was used as the EO crystal to detect the normal electric field component (i.e., relative to the device under test (DUT)), while <110> GaAs was used to sense tangential fields. The orthogonal tangential fields are distinguished by rotating the relative orientation between the <110> GaAs tip and the DUT by 90°.

The sensor end of the fiber is attached to a supporting arm mounted on the computer controlled X-Y translation stage to allow the fiber-mounted probe to be scanned in two directions. All the materials around the sensor area, including the GRIN lens and fiber, have permittivities around 4, except for the GaAs tip itself, which has $\epsilon_r$ of 12, much lower than nearly all conventional EO crystals by more than a factor of 3. Thus the fiber-based system can be expected to reduce any effect of the sensor on the DUT significantly. Furthermore, the measurement flexibility is dramatically improved since the probe may be freely positioned without restrictions arising from the placement of the other optical components or the DUT.

The input RF frequency to the DUT (from the second synthesizer of FIG. 1 ) is selected to be an integer multiple of the pulse repetition rate of the laser (80 MHZ) plus an additional offset frequency (3.0 MHZ). Using harmonic mixing, the lock-in amplifier receives the 3-MHZ intermediate frequency arising from the difference signal between the synthesizer input and the laser-harmonic local oscillator. A computer records the amplitude and phase of the IF at each measurement point. The 3-MHZ intermediate frequency is the same as the reference frequency of the first synthesizer of FIG. 1.

The probe tip fabrication procedure or method is illustrated in FIGS. 4–7. The fabrication procedure begins with a sample of GaAs having a crystal orientation of 100 or 110. The 100 crystal orientation GaAs sample allows sensing of the "normal" component of the microwave electric field, while the 110 crystal orientation of the GaAs sample allows sensing of the tangential components of the microwave electric field. It is believed that a combination of two or more crystals can be packaged together with two or more optic fibers to measure several field vectors simultaneously. The 100 or 110 crystal orientation GaAs sample has a photoresist (PR 1827) material applied while the sample is rotating at 3,500 revolutions per minute (rpm) for 30 seconds and baked at 105° C. for 1 minute. The sample is then exposed to ultraviolet light for 15 seconds, exposed to a developer (AZ 351) for 50 seconds, and hard baked at 105° C. for 1 minute to create the desired exposed photoresist (PR 1827) pattern. The GaAs sample and photoresist (PR 1827) pattern are mounted on a glass substrate using clear wax on a 150° C. hot plate. The fabrication procedure then continues by wet etching using $H_2SO_4:H_2O_2:H_2O$ in 1:8:1 ratios plus (+) a minute amount (a few drops) of $NH_4OH$. The wet etchant is agitated for 30 seconds, every 30 seconds, and the etchant solution is changed every 10 minutes. The agitation is used and the etchant is changed in order to ensure the uniformity of the etching. Preferably, the agitation is random. This step removes the GaAs material left unprotected by the photoresist (PR 1827) pattern. The sample is then subject to photolithographic processing, where the sample with the photoresist (PR 1827) on top is exposed to ultraviolet (UV) light without the mask for 15 seconds and exposed to the developer (AZ 351) for 90 seconds. The exposure and the developing steps without the mask are executed in order to remove the photoresist (PR 1827) patterns that were originally covering the portions of the GaAs that were to be protected from being etched away. The fabrication procedure then proceeds with a distributed Bragg reflector (DBR) deposition of $MgF_2$=1,403 Angstrom (Å) ZnSe=833 Angstrom (Å) in 4 sets. The final probe tip is released in a hot acetone bath.

Figure 5:
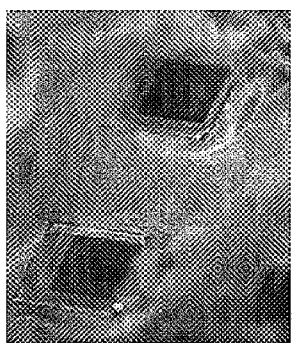
Figure 5:
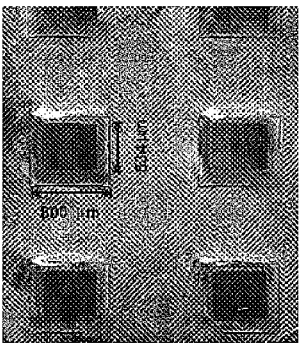
Figure 5:
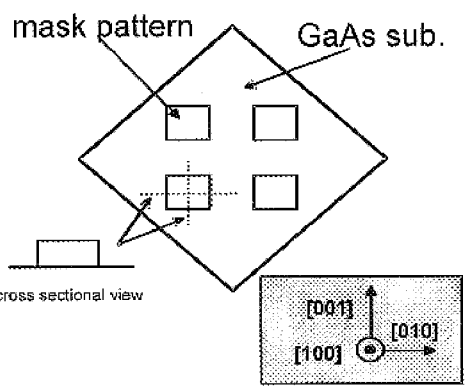
Figure 5:
Figure 5:
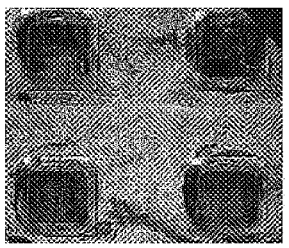
Figure 5:
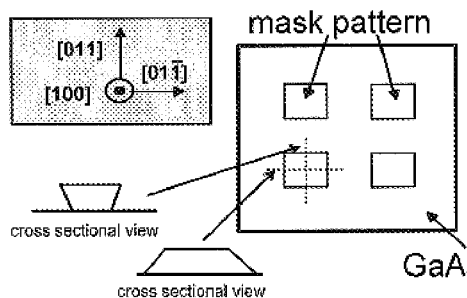
Figure 6:
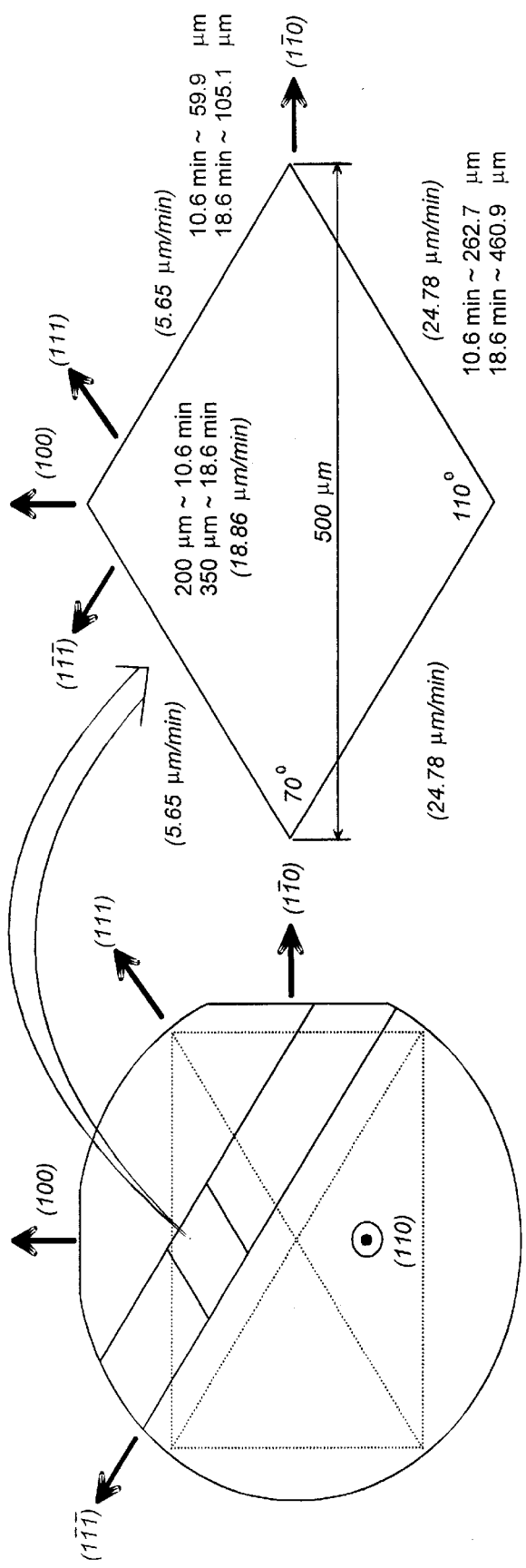
Figure 7:
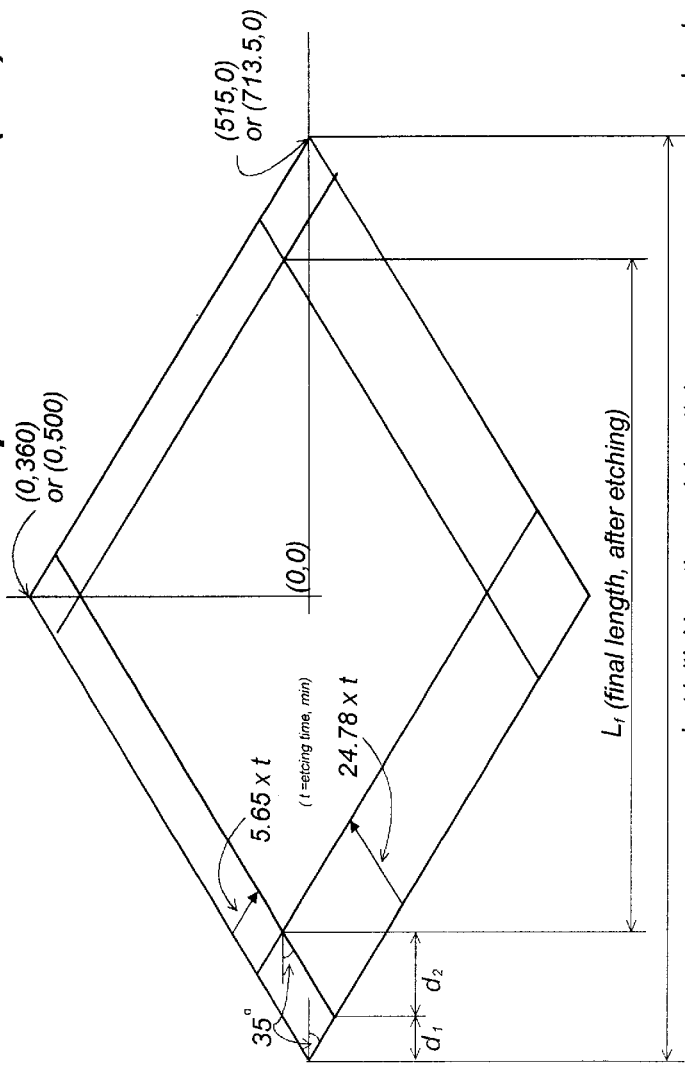
Figure 8:
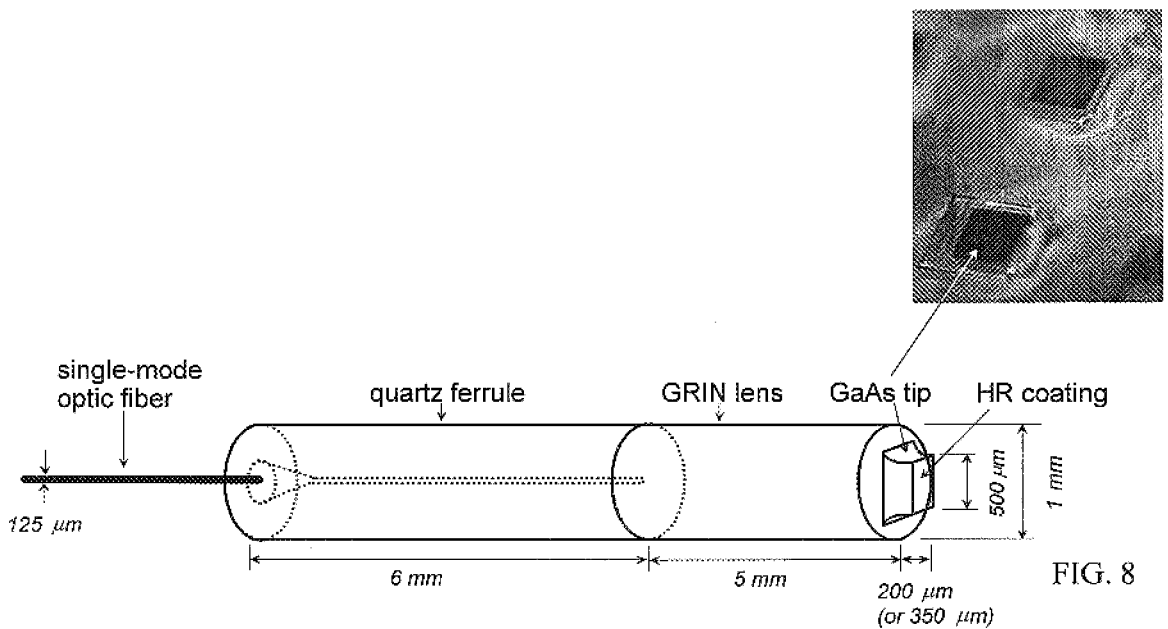
FIG. 8 illustrates a probe head assembly according to the present invention.

As can best be seen in FIG. 5, the photoresist pattern is formed on the GaAs substrate and the material is then subjected to the etching step. The etching depth is approximately 160 micrometers ($\mu$m) obtained at a rate of approximately 7.95 micrometers ($\mu$m) per minute over a 20 minute time period. Lateral etching depth of approximately 130 micrometers ($\mu$m) to approximately 150 micrometers ($\mu$m) occurs at a rate of approximately 6.5 micrometers ($\mu$m) to approximately 7.5 micrometers ($\mu$m) per minute. As best seen in FIGS. 7 and 8, the goal during the fabrication procedure is to obtain a probe tip with a final length after etching of approximately 500 micrometers ($\mu$m). The etching process removes material at varying rates depending on the orientation of the mask requiring calculation of the initial mask size based on the etching time as set forth in the equation shown in FIG. 7.

The probe head assembly according to the present invention is illustrated in FIG. 8. The single-mode optical fiber is inserted into one end of a quartz ferrule of approximately 6 millimeters (mm) in length. A gradient index lens of approximately 5 millimeters (mm) in length is connected at the opposite end of the quartz ferrule. The GaAs tip is connected to the opposite end of the gradient index lens from the quartz ferrule. The GaAs tip is approximately 500 micrometers ($\mu$m) square and has a thickness of approximately 200 micrometers ($\mu$m) or 350 micrometers ($\mu$m). The overall diameter of the quartz ferrule and gradient index lens is approximately 1 millimeter (mm).

It is expected that a wide variety of additional electrical-optic materials can be substituted for GaAs as a sensor in the fiber-based electric-field-imaging system. These can include (a) other semiconductor materials; (b) non-semiconductor solid-state crystals; (c) organic crystals; and (d) polymers. The semiconductors can be chemically etched to the desired shape and dimensions, while it would be necessary to mechanically machine and polish the other crystals. Polymer films can be introduced in a solution from which the solvent is allowed to evaporate either before or after poling of the polymer with a direct current (DC) electric field.

It is believed that suitable electro-optic materials can include (a) aluminum-gallium arsenide (AlGaAs), indium phosphide (InP), cadmium telluride (CdTe), zinc selenide (ZnSe), zinc telluride (ZnTe), bismuth silicate ($Bi_{12}SiO_{20}$), cadmium sulfide (CdS), Cadmium Selenide (CdSe).

It is believed that additional electro-optic materials can be used in the fabrication of an electric-field sensor as these new synthesized materials become available, particularly in the area of polymers having the desired electro-optic properties for the present application.

Further details of the present invention can be obtained from articles entitled "Microwave-Field Imaging with Fiber-Based Electro-Optical Probe" written by authors K. Yang, L. P. B. Katehi, and J. F. Whitaker, published in 2000 IEEE LEOS Annual Meeting Conference Proceedings on November 2000; "Fiber-Based Electro-Optic Field Imaging System" written by authors K. Yang, L. P. B. Katehi, and J. F. Whitaker, published in 2001 Ultrafast Electronics and Optoelectronics Conference on January 2001; "Electric Field Mapping System Using An Optical-Fiber-Based Electro-Optic Probe" written by authors K. Yang, L. P. B. Katehi, and J. F. Whitaker, published in IEEE Microwave and Wireless Components Letters on April, 2001; and U.S.

Provisional Patent Application Ser. No. 60/210,880 filed on Jun. 9, 2000, all of which are incorporated by reference herein in their entirety.

The present invention is believed to be applicable to a number of different applications, by way of example and not limitation, such as quality control along microwave-circuit production lines, where as a circuit passes by, the probe could be dipped into key internal nodes to probe the functionality of the circuit; trouble-shooting of cross-talk within microwave enclosures, where inserting the probe through a small aperture in a microwave or mixed-circuit package in order to investigate where strong fields build up once the package is sealed; validation of circuit or electromagnetic theoretical and/or computer models, such as for microwave circuits or elements, where measuring fields in locations that are otherwise inaccessible enables the accuracy of computations of these fields to be determined; electromagnetic interference, where investigating the source of strong fields within complex systems would enable designers to avoid interference between components and enable effective shielding; and measurement of microwave electric fields in vivo or at the surface of the skin for biomedical imaging.

EXAMPLE 1

In order to demonstrate the versatility of the fiber-based EO field-mapping system, the normal electric field component inside of a shielded microstrip transmission line, which may not be obtained by any other measurement method, including free-space EO field mapping, was imaged using the <100>-oriented GaAs probe tip. This field pattern was then compared with the field distribution from an identical microstrip without a shielding cavity. For the measurement, a 50-$\Omega$ microstrip transmission line was fabricated on a duroid substrate with 75-mil thickness and a dielectric constant ($\epsilon_r$) of 6.15. The output port of the microstrip was short-terminated in order to provide a standing wave pattern.

Figure 9:
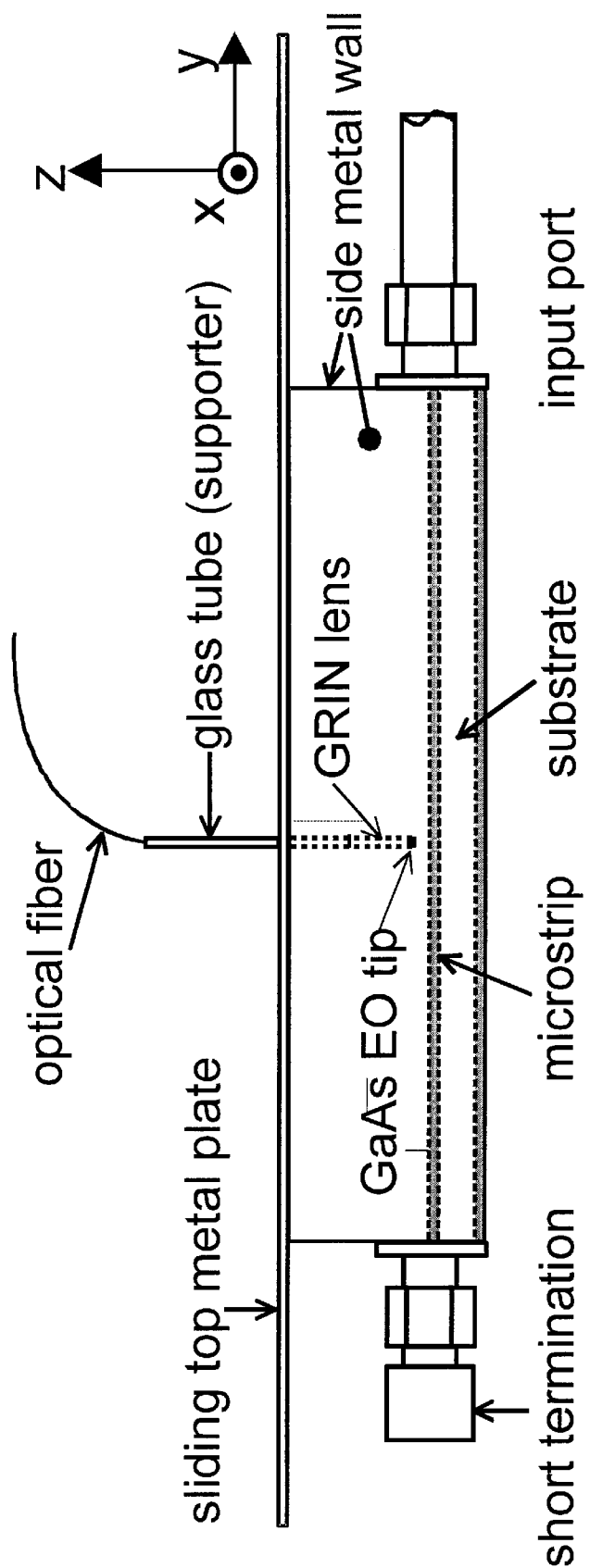
FIG. 9 illustrates a closed metal cavity according to the present invention allowing a probe tip to have freedom of movement in three dimensions within the closed metal cavity using an oversized sliding top metal plate to cover the enclosure.

The height of the cavity wall was 6.0 mm above the top surface of the microstrip. In order for the probe tip to have freedom of movement to three dimensions in the closed metal cavity, an oversized sliding top metal plate was employed to complete the enclosure. A 2-mm diameter access aperture in the sliding top plate allowed the EO probe to be positioned inside of the cavity as shown in FIG. 9. Since the top plate and the fiber-based EO probe were mechanically connected to the x-y translation stage, the probe could scan a two-dimensional field distribution from the interior of the cavity, while the top plate maintained electrical contact to the cavity walls. In addition to the two-dimensional (i.e., x-y plane) field mapping capability, the vertical position (z-direction) of the probe could be adjusted externally.

For both exposed and shielded microstrip, the normal electric fields were measured at distances of 1.0, 2.5, and 5.0 mm from the top of the microstrip surface. The scanning window was 2.9 cm (x) by 3.9 cm (y), using the step sizes (and thus also the spatial resolutions) of 580 micrometer ($\mu$m) (x) and 780 micrometer ($\mu$m) (y). Each field map was acquired in approximately 15 minutes.

The results show typical standing wave patterns that have periodic peaks with 180° phase changes. The separation between the peaks on the microstrip was 0.87 mm, which shows excellent agreement with the theoretically expected peak-to-peak distance. The peak amplitudes were reduced by 16 dB as the measurement distance increased from 1.0 mm to 5.0 mm for the exposed microstrip.

Figure 10:
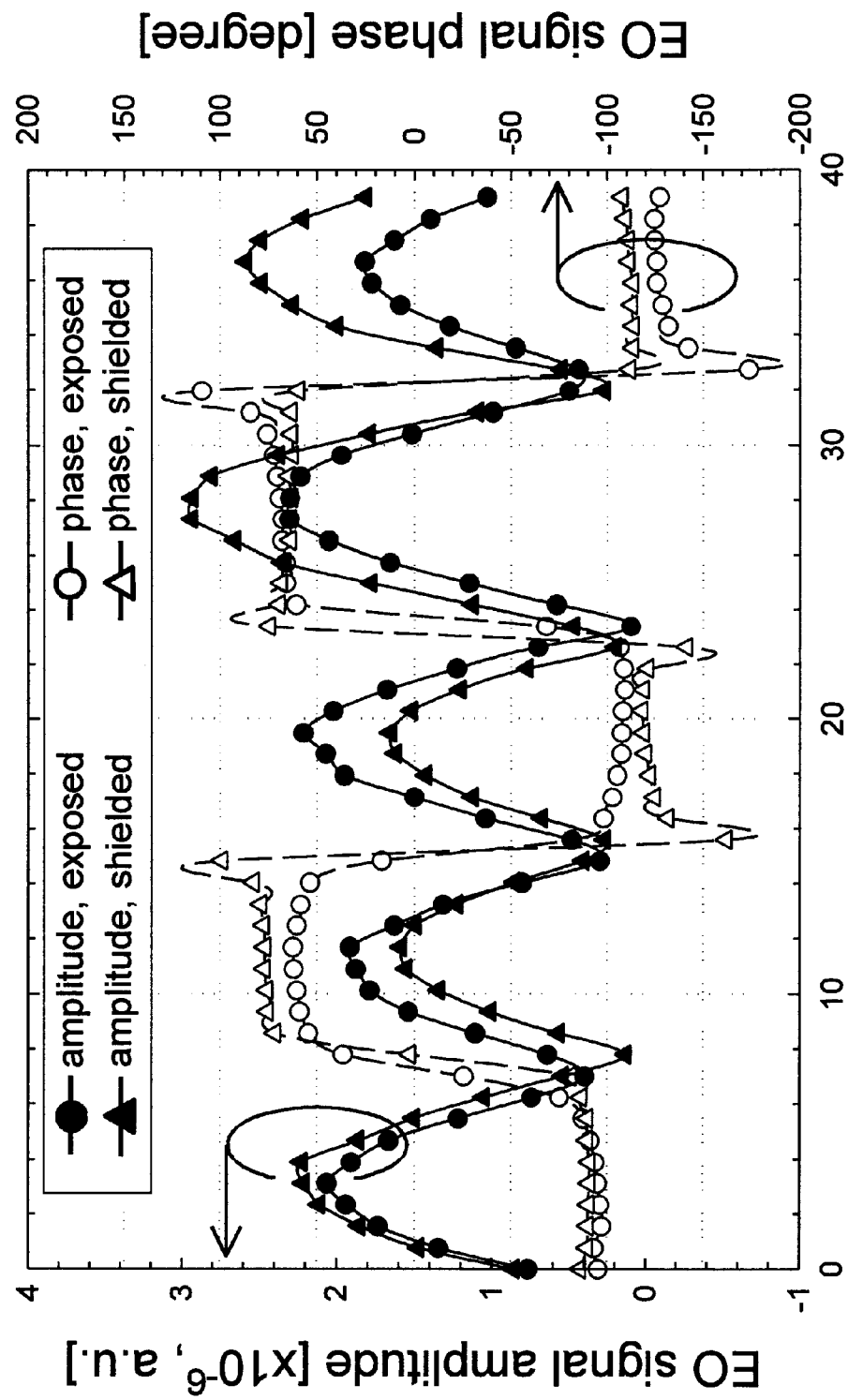
FIG. 10 illustrates only a one-dimensional comparison between an exposed and a shielded microstrip along the corresponding centerlines at a 1.0-mm height according to the present invention.

While two-dimensional field maps were extracted at all three measurement heights, in FIG. 10 only the one-dimensional comparison between the exposed and shielded microstrip along the centerlines at a 1.0-mm height is shown. The phases show virtually identical changes of 180° for each amplitude peak. However, a nonuniform amplitude distribution is observed on the shielded microstrip, while the exposed microstrip exhibits a reasonably uniform amplitude distribution. Since the geometries of the two microstrips (including the size of the substrate) are identical, the most plausible explanation for the amplitude discrepancy is the existence of a cavity-mode wave. The cavity mode wave was thus calculated based on the cavity resonator theory, and the effect of the microstrip substrate was taken into account using the cavity perturbation theory. Superimposing the calculated cavity standing wave pattern on the exposed microstrip result demonstrates that the cavity measurement accurately reveals the effect of the enclosure on the microstrip.

While the two-dimensional field images of relatively simple structures could also be computed using numerical full-wave analysis methods, this striking experimental example shows that the actual field patterns can be extracted from a package for the purposes of fault analysis or to diagnose sources of cross-talk or interference that are not quickly or easily computed.

EXAMPLE 2

In order to demonstrate the application of this fiber-based field-mapping probe to radiating waves, and also to use the transverse-field measurement capability, the dominant electric field component of a Ka-band horn was scanned using a <110> GaAs probe tip both in the aperture plane (plane A) and in a plane that was two wavelengths from the aperture within the interior of the horn (plane B). The scanning areas were 3.39 cm×5.57 cm for plane A and 2.78 cm×4.17 cm for plane B, with plane B being reduced in size due to the natural taper of the microwave horn antenna. Fifty scanning steps were used for both the x- and y-directions, with a single scan taking approximately 30 minutes.

The results indicate, as expected, that there is a more uniform field distribution for both amplitude and phase at the aperture, while the wave front is quite curved inside of the horn cavity. Specifically, the phase of the field at the aperture has an almost uniform distribution, while it displays about a 50° phase variation across the scanned area along the y-axis on the plane B.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electro-optic field-mapping system for scanning at least a near field electric pattern of a workpiece to be tested while operating in a steady-state, continuous-wave, condition comprising:

means for generating an optical signal;

an electro-optic field-mapping sensor including an electro-optic crystal having a high-reflective coating of multiple dielectric layers and mounted on an end of an optical fiber for receiving the generated optical signal, and the multiple dielectric layers of the sensor for generating a reflected optical signal in response to a free-space electromagnetic field associated with a workpiece to be tested passing through the sensor changing an index of refraction of the sensor and polarization of the optical signal being reflected to directly achieve at least one dimensional frequency domain, steady-state, electric field distribution mapping simultaneously for amplitude and phase in at least a near field electric pattern;

means for sensing polarization modulation of the reflected optical signal; and means for evaluating the workpiece to be tested by analyzing the polarization modulation of the reflected optical signal.

2. The system of claim 1 further comprising:

the sensor having at least one crystal with a predetermined orientation.

3. The system of claim 2 further comprising:

the crystal made of at least one electro-optic material layer selected from a group of materials consisting of gallium arsenide (GaAs), aluminum-gallium arsenide (AlGaAs), indium phosphide (InP), cadmium telluride (CdTe), zinc selenide (ZnSe), zinc telluride (ZnTe), bismuth silicate ($Bi_{12}SiO_{20}$), cadmium sulfide (CdS), Cadmium Selenide (CdSe), composites thereof, and mixtures thereof.

4. The system of claim 1 further comprising: the sensor mounted directly to an optical fiber.

5. The system of claim 4 further comprising:

the sensor having a gradient index lens operably mounted with respect to the optical fiber.

6. The system of claim 1 further comprising:

the sensor having a crystal with at least one crystal orientation layer selected from an orientation of <100> and <110>.

7. The system of claim 6 further comprising:

the crystal formed from micromachined gallium arsenide.

8. The system of claim 1 further comprising:

the sensor for detecting up to three orthogonal polarizations of electric fields.

9. The system of claim 1 further comprising:

the sensor for detecting microwave electric-fields to be mapped.

10. The system of claim 1 further comprising:

means for producing a two-dimensional map of amplitude and phase corresponding to an electric field in any plane above the workpiece to be tested.

11. The system of claim 1 further comprising:

means for scanning electromagnetic fields in one part of a microwave workpiece to be tested relative to any other part of the microwave workpiece.

12. The system of claim 1 further comprising:

means for scanning electromagnetic fields within an interior of an enclosed microwave package.

13. The system of claim 1 further comprising:

means for translating the sensor in increments of movement along first and second axes lying in a plane perpendicular to one another.

14. The system of claim 13 further comprising:

the increments of movement independently selectable for the first and second axes.

15. The system of claim 13 further comprising:

means for adjusting a position of the sensor along a third axis perpendicular to the first and second axes.

16. An electro-optic field-mapping system for scanning a workpiece to be tested comprising:

means for generating an optical signal;

an electro-optic field-mapping sensor for receiving the generated optical signal and for generating a reflected optical signal in response to a free-space electromagnetic field associated with a workpiece to be tested passing through the sensor changing an index of refraction of the sensor and polarization of the optical signal being reflected;

means for sensing polarization modulation of the reflected optical signal;

means for evaluating the workpiece to be tested by analyzing the polarization modulation of the reflected optical signal; and a metal enclosure having a bottom, at least one side extending around a periphery of the bottom, and a cover slidably engageable with the at least one side for movement along first and second axes extending perpendicular with respect to one another in a plane of movement.

17. The system of claim 16 further comprising:

the cover having an aperture extending therethrough for adjustably receiving the sensor therein for movement along a third axis extending perpendicular to the first and second axes.

18. An electro-optic field-mapping system for scanning a workpiece to be tested comprising:

means for generating an optical signal;

an electro-optic field-mapping sensor for receiving the generated optical signal and for generating a reflected optical signal in response to a free-space electromagnetic field associated with a workpiece to be tested passing through the sensor changing an index of refraction of the sensor and polarization of the optical signal being reflected;

means for sensing polarization modulation of the reflected optical signal;

means for evaluating the workpiece to be tested by analyzing the polarization modulation of the reflected optical signal;

means for comparing a two-dimensional map of amplitude and phase corresponding to an electric field in at least one plane above the workpiece to be tested with a two dimensional array of minimum and maximum acceptable values for each measurement taken for the workpiece to be tested; and means for determining if the workpiece to be tested is defective based on results from the comparing means.

19. A method for scanning at least a near field electric pattern of a workpiece to be tested while operating in a steady-state, continuous-wave, condition with an electro-optic field-mapping system comprising the steps of:

generating an optical signal;

receiving the generated optical signal with an electro-optic field-mapping sensor including an electro-optic crystal having a high-reflective coating of multiple dielectric layers and mounted on an end of an optical fiber;

generating a reflected optical signal with the electro-optic field-mapping sensor in response to a free-space electromagnetic field associated with a workpiece to be tested passing through the sensor changing an index of refraction of the sensor and polarization of the optical signal being reflected to directly achieve at least one dimensional frequency domain, steady-state, electric field distribution mapping simultaneously for amplitude and phase in at least a near field electric pattern;

sensing polarization modulation of the reflected optical signal; and evaluating the workpiece to be tested by analyzing the polarization modulation of the reflected optical signal.

20. The method of claim 19 further comprising:

the sensor having at least one crystal with a predetermined orientation.

21. The method of claim 20 further comprising:

the crystal made of at least one electro-optic material layer selected from a group of materials consisting of gallium arsenide (GaAs), aluminum-gallium arsenide (AlGaAs), indium phosphide (InP), cadmium telluride (CdTe), zinc selenide (ZnSe), zinc telluride (ZnTe), bismuth silicate ($Bi_{12}SiO_{20}$), cadmium sulfide (CdS), Cadmium Selenide (CdSe), composites thereof, and mixtures thereof.

22. The method of claim 19 further comprising the step of:
mounting the sensor directly to an optical fiber.

23. The method of claim 22 further comprising the step of:
operably mounting a gradient index lens with respect to the optical fiber.

24. The method of claim 19 further comprising the step of:
selecting a crystal with at least one crystal orientation layer from an orientation of <100> and <110> for the sensor.

25. The method of claim 24 further comprising the step of:
forming the crystal from micromachined gallium arsenide.

26. The method of claim 19 further comprising the step of:
detecting up to three orthogonal polarizations of electric fields with the sensor.

27. The method of claim 19 further comprising the step of:
detecting microwave electric-fields to be mapped with the sensor.

28. The method of claim 19 further comprising the step of:
producing a two-dimensional map of amplitude and phase corresponding to an electric field in any plane above the workpiece to be tested.

29. The method of claim 19 further comprising the step of:
scanning electromagnetic fields in one part of a microwave workpiece to be tested relative to any other part of the microwave workpiece.

30. The method of claim 19 further comprising the step of:
scanning electromagnetic fields within an interior of an enclosed microwave package.

31. The method of claim 19 further comprising the step of:
translating the sensor in increments of movement along first and second axes lying in a plane perpendicular to one another.

32. The method of claim 31 further comprising the step of:
selecting the increments of movement independently for the first and second axes.

33. The method of claim 31 further comprising the step of:
adjusting a position of the sensor along a third axis perpendicular to the first and second axes.

34. A method for scanning a workpiece to be tested with an electro-optic field-mapping system comprising the steps of:

generating an optical signal;

receiving the generated optical signal with an electro-optic field-mapping sensor;

generating a reflected optical signal with the electro-optic field-mapping sensor in response to a free-space electromagnetic field associated with a workpiece to be tested passing through the sensor changing an index of refraction of the sensor and polarization of the optical signal being reflected;

sensing polarization modulation of the reflected optical signal;

evaluating the workpiece to be tested by analyzing the polarization modulation of the reflected optical signal; and slidably engaging a cover of a metal enclosure having a bottom, and at least one side extending around a periphery of the bottom, the cover engageable with the at least one side for movement along first and second axes extending perpendicular with respect to one another in a plane of movement.

35. The method of claim 34 further comprising the step of:
adjustably receiving the sensor in the cover through an aperture extending therethrough for movement along a third axis extending perpendicular to the first and second axes.

36. A method for scanning a workpiece to be tested with an electro-optic field-mapping system comprising the steps of:

generating an optical signal;

receiving the generated optical signal with an electro-optic field-mapping sensor;

generating a reflected optical signal with the electro-optic field-mapping sensor in response to a free-space electromagnetic field associated with a workpiece to be tested passing through the sensor chanting an index of refraction of the sensor and polarization of the optical signal being reflected;

sensing polarization modulation of the reflected optical signal;

evaluating the workpiece to be tested by analyzing the polarization modulation of the reflected optical signal;

comparing a two-dimensional map of amplitude and phase corresponding to an electric field in at least one plane above the workpiece to be tested with a two dimensional array of minimum and maximum acceptable values for each measurement taken for the workpiece to be tested; and determining if the workpiece to be tested is defective based on results from the comparing means.

* * * * *